United States Patent
Shirotori

(10) Patent No.: US 7,242,260 B2
(45) Date of Patent: Jul. 10, 2007

(54) REAL TIME CLOCK APPARATUS

(75) Inventor: Toru Shirotori, Minami-Minowa (JP)

(73) Assignee: Seiko Epson Corporation (JP)

( * ) Notice: Subject to any disclaimer, the term of this patent is extended or adjusted under 35 U.S.C. 154(b) by 42 days.

(21) Appl. No.: 11/294,755

(22) Filed: Dec. 6, 2005

(65) Prior Publication Data

US 2006/0158272 A1   Jul. 20, 2006

(30) Foreign Application Priority Data

Dec. 7, 2004   (JP) .............................. 2004-353668
Dec. 2, 2005   (JP) .............................. 2005-348811

(51) Int. Cl.
 *H03B 1/00* (2006.01)
(52) U.S. Cl. ........................................ 331/74; 331/65
(58) Field of Classification Search .................. 331/74, 331/65
 See application file for complete search history.

(56) References Cited

U.S. PATENT DOCUMENTS

2003/0061529 A1 *   3/2003   Iwasa .......................... 713/600

FOREIGN PATENT DOCUMENTS

| JP | 05-053703 | 3/1993 |
|---|---|---|
| JP | 2504190 | 4/1996 |

* cited by examiner

*Primary Examiner*—Joseph Chang
(74) *Attorney, Agent, or Firm*—Harness, Dickey & Pierce, P.L.C.

(57) ABSTRACT

A given length of an input signal can be detected with small power consumption. A real time clock apparatus has an oscillating module which outputs an original oscillating clock signal having a predetermined frequency, a plurality of dividing modules which divides the original oscillating clock signal outputted from the oscillating module to generate clock signals having a period different from each other, a clock selecting circuit which outputs a clock signal having a given period outputted from the dividing module based on the supplied selection signal, and a signal detecting circuit which is connected to an external switch and which detects a length of an inputted signal by a clock signal outputted from the clock selecting circuit and senses whether the inputted signal is an input signal from the switch.

6 Claims, 3 Drawing Sheets

REAL TIME CLOCK APPARATUS

BACKGROUND OF THE INVENTION

1. Technical Field

The present invention relates to a real time clock apparatus which is mounted on an electronic appliance to keep time and output a reference clock signal for synchronization with processing.

2. Related Art

It is known that when a mechanical switch etc., is switched from on to off or from off to on, chattering occurs that may cause malfunctions of an electronic appliance. Therefore, heretofore, a signal source such as a switch is connected to an integrated circuit formed of capacitance C and resistance R to remove chattering. However, since a chatter filtering circuit using the integrated circuit is varied in its filtering characteristics depending on the voltage characteristics and temperature characteristics of devices, it can remove minute pulses and noise, but it is difficult to accurately filter the input signal length to selectively output signals. Once the device constant is set, it is difficult to change sensitivity in a finished product. In addition to this, there is a unit to detect and process switch signals, etc. by software to determine validity of input signals. However, the difference in CPU process capability and influence of interrupt processing cause variations in determinations.

JP-A-5-53703 describes a microprocessor provided with a chatter filtering circuit which removes chattering by a logic circuit with no use of a capacitor and a resister. The chatter filtering circuit is configured of a clock generator circuit, a shift register formed of a plurality of stages, a NAND circuit and a NOR circuit disposed on the output side of the shift register, an RS flip flop to which the outputs of the NAND circuit and the NOR circuit are inputted, and so on. Each stage of the shift register is inputted with a clock signal outputted from the clock generator circuit, and a first stage of the shift register is inputted with an external input signal. Furthermore, the output of each stage of the shift register and an input signal are inputted to the NAND circuit and the NOR circuit to remove chattering. In the chatter filtering circuit, the frequency of clock signals outputted from the clock generator circuit is set to take out a given length of input signals separately from chattering.

However, the chatter filtering circuit described in JP-A-5-53703 is required to have a clock generator circuit exclusive for use in removal of chattering inside the microprocessor. Thus, in the chatter filtering circuit of JP-A-5-53703, the clock generator circuit needs to be continuously operated to remove chattering and to detect input signals, causing an increase in power consumption of an electronic appliance. Particularly, in recent years, electronic appliances are increasingly reduced in size and are formed into portables, including cellular phones, and many electronic appliances are operated by a built-in battery. There is an increasing demand for a reduction in power consumption. Moreover, in recent years, a CPU, the core of electronic appliances, is demanded to have many functions, and the number of switches provided in electronic appliances is growing. Therefore, the load of the CPU is significantly increased because of monitoring the conditions of these switches and an increase in interrupt processing, possibly causing operational delay.

The invention has been made to solve these problems, and an object is to surely detect a given length of an input signal with small power consumption.

Furthermore, an object of the invention is to remove noise such as chattering to very accurately detect only a valid input signal with respect to a length of time that is freely set by a system.

Moreover, an object of the invention is to confirm whether an input signal is made even though an electronic appliance main body is not operated.

SUMMARY

In order to achieve the objects, a real time clock apparatus according to the invention is characterized by including: an oscillating module which outputs an original oscillating clock signal having a predetermined frequency; a dividing module which divides the original oscillating clock signal outputted from the oscillating module a plurality of times to generate and output a plurality of clock signals having periods different from each other; a clock selecting module which outputs a given clock signal among a plurality of the clock signals based on a supplied selection signal; and a signal detecting circuit which is connected to an external signal source, and which detects a length of an inputted signal by the clock signal outputted from the clock selecting circuit and senses whether the inputted signal is an input signal from the signal source.

The invention thus configured is mountable on most electronic appliances, and detects an input signal by using the clock signal outputted from the oscillating module of the real time clock apparatus which outputs the clock signal all the time. Therefore, it is unnecessary to dispose an oscillating module, etc., for exclusive use to detect an input signal, power consumption is rarely increased, and the input signal can be detected at very low energy. In addition to this, the clock signal having a period different from each other that is obtained by dividing the original oscillating clock signal outputted from the oscillating module a plurality of times is selected for use in detecting an input signal. Thus, the clock signal to be selected is changed to surely detect input signals in various lengths. Furthermore, since an input signal is detected based on the clock signal outputted from the oscillating module, more highly accurate settings can be done as compared to detection by software processing, and input signals in different lengths can be detected highly accurately.

The signal detecting circuit can be provided with: a signal length detecting module which detects that the input signal has a predetermined length or longer by a period of the clock signal; and a detection storing module which holds detected information when the signal length detecting module detects the input signal. The real time clock apparatus is always operated even though an electronic appliance main body is not operated, and typically has functions of storing and backing up data. Therefore, the detection storing module is provided to easily confirm whether an input signal is made while the electronic appliance main body is not operated, when the electronic appliance main body is actuated.

Detection of the length of the inputted signal can be done as a rise or a fall of the clock signal is a reference. When the rise or fall of the clock signal is a reference, the length of the inputted signal can be detected easily. Furthermore, the signal detecting circuit can output a clock output stop signal that allows the clock selecting circuit to stop outputting the clock signal when the input signal is detected. When this is done, for example, in the case where the electronic appliance main body is not operated when the signal detecting circuit detects an input signal, the operation of the clock selecting circuit is stopped to further reduce power consumption. The clock output stop signal outputted from the signal detecting circuit may enter the clock selecting circuit through a delay circuit. When this is done, flexibility is improved to expand the applicable range. The delay circuit may defer the inputted clock output stop signal based on the clock signal outputted from the clock selecting circuit. When this is done, an oscillator circuit to clock the time to delay the clock output stop signal is unnecessary.

BEST MODE FOR CARRYING OUT THE INVENTION

Preferable embodiments of a real time clock apparatus according to the invention will be described in detail with reference to the drawings.

Figure 1:
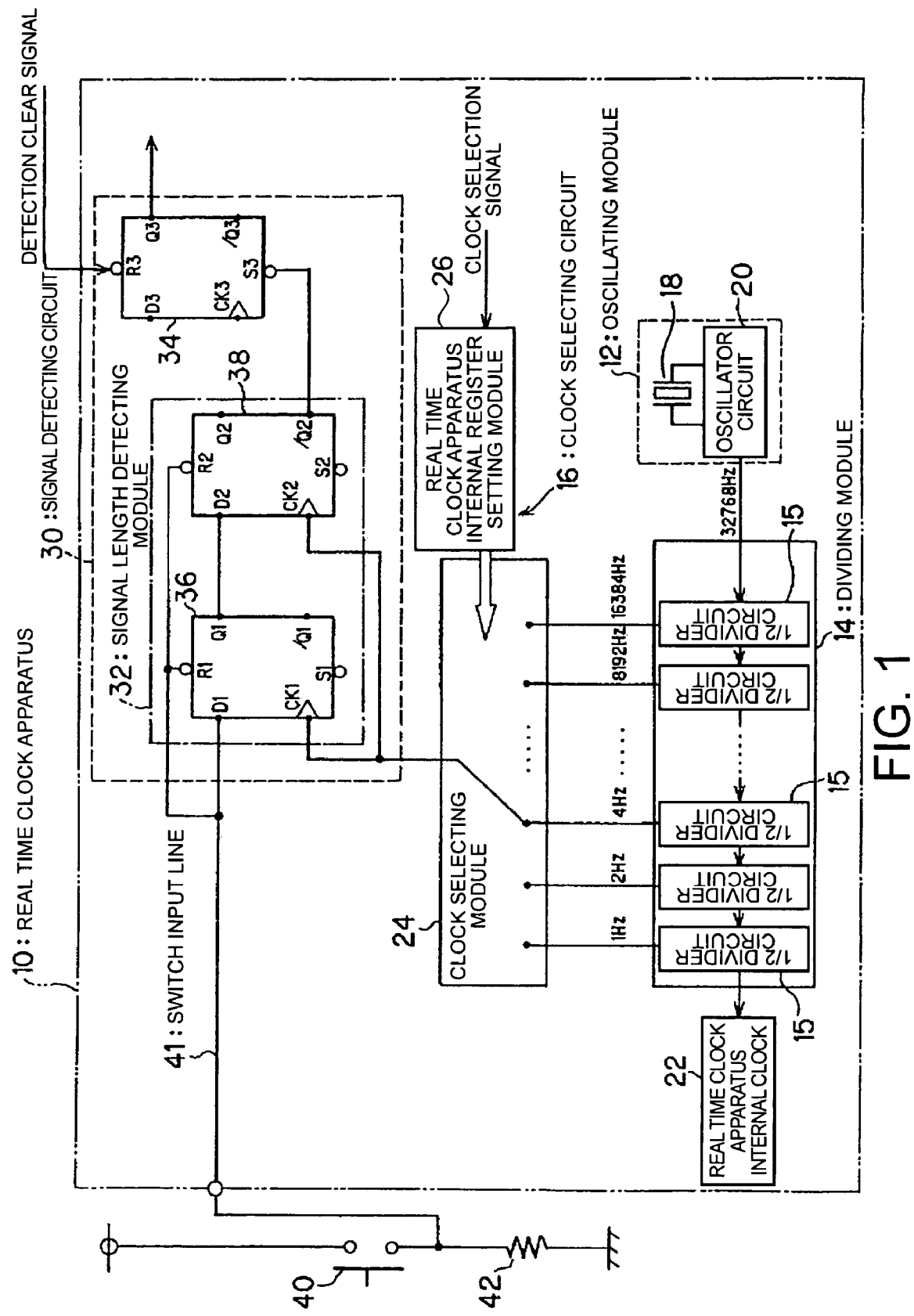
FIG. 1 is a block diagram illustrating part of a real time clock apparatus of an embodiment according to the invention.

FIG. 1 is a block diagram illustrating part of a real time clock apparatus of an embodiment according to the invention. In FIG. 1, a real time clock apparatus 10 has an oscillating module 12, a dividing module 14 disposed on the output side of the oscillating module 12, and a clock selecting circuit 16 disposed on the output side of the dividing module 14. The oscillating module 12 is formed of a piezoelectric vibrator 18, and an oscillator circuit 20 which excites the piezoelectric vibrator 18. In the case of the embodiment, the piezoelectric vibrator 18 is formed of a tuning fork-type quartz crystal oscillator having an excitation frequency (oscillator frequency) of 32768 Hz, in which the oscillator circuit 20 excites the piezoelectric vibrator 18 to output an original oscillating clock signal of 32768 Hz to the dividing module 14.

The dividing module 14 is capable of outputting the original oscillating clock signal of 32768 Hz inputted from the oscillating module 12 as it is, and has a plurality of ½ divider circuits 15. Each of the divider circuits 15 is connected to each other in multi-stage, which sequentially divides the inputted original oscillating clock signal of 32768 Hz by half step by step, and generates a one-second signal of 1 Hz. Then, the dividing module 14 outputs the one-second signal to an internal clock 22 in the real time clock apparatus 10, and sends out to the clock selecting circuit 16 clock signals that are divided and generated at each stage of each of the ½ divider circuits 15 having periods different from each other.

The clock selecting circuit 16 is configured of a clock selecting module 24 and an internal register setting module 26. The internal register setting module 26 is inputted with a clock selection signal from an operating module, etc., not shown, disposed outside the real time clock apparatus 10. Then, the internal register setting module 26 sets an address of the clock selecting module 24 so that the clock signal having a frequency specified by the clock selection signal is outputted from the clock selecting module 24.

The real time clock apparatus 10 has a signal detecting circuit 30 disposed on the output side of the clock selecting circuit 16. The signal detecting circuit 30 is configured of a signal length detecting module 32 and a D-FF 34 to be a detection storing module. In the case of the embodiment, the signal length detecting module 32 is configured of two delay flip flops (D-FF) 36 and 38, having set terminals S (S1, S2) and reset terminals R (R1, R2). The D-FF 36 has a D1 input terminal connected to one of contacts of a switch 40 which is an external signal source of the real time clock apparatus 10. For example, the switch 40 is a press button switch and a memory switch in which a switch input signal "H" enters a switch input line 41 only when the switch 40 is pressed down. One of the contacts of the switch 40 to which the D-FF 36 is connected is grounded through a resister 42. Furthermore, the other contact of the switch 40 is connected to a circuit power source Vcc.

The D-FFs 36 and 38 configure a serial input and serial output type shift register, and a Q1 output terminal of the D-FF 36 is connected to a D2 input terminal of the D-FF 38. Then, the output terminal of the clock selecting module 24 is connected to Ck (Ck1, Ck2) input terminals of each of the D-FFs 36 and 38, so that clock signals can be supplied to the Ck input terminal of each of the D-FFs 36 and 38 at the same time. Moreover, the reset terminal R of each of the D-FFs 36 and 38 is connected to the contact on the ground side of the switch 40 to which a Q1 input terminal of the D-FF 36 is connected.

A /Q2 (Q2 bar) output terminal of the D-FF 38 is an output terminal of the signal length detecting module 32, which is connected to the D-FF 34 which is the detection storing module. The D-FF 34 has a set terminal S3 and a reset terminal R3, in which the set terminal S3 is connected to the /Q2 output terminal of the D-FF 38. Furthermore, the D-FF 34 is formed to receive a detection clear signal from a CPU, not shown, at the reset terminal R3. Then, a Q3 output terminal of the D-FF 34 is an output terminal of the signal detecting circuit 30. As described later, when a signal having a predetermined length or above enters the signal detecting circuit 30, a detection signal is outputted to the CPU as it is an input signal generated by pressing the switch 40. In addition, each of the D-FFs 34, 36 and 38 is operated in which the set terminal S and the reset terminal R are operated in negative logic. Moreover, the D-FFs 34, 36 and 38 are operated at a rise time of the clock signal that enters the Ck (Ck1 to Ck3) input terminal.

Figure 2:
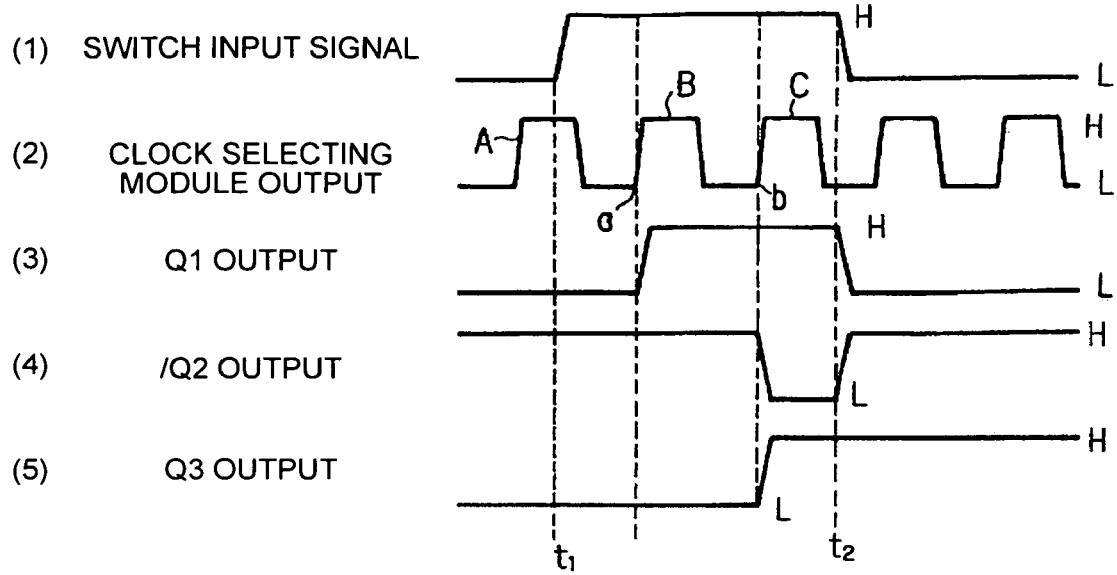
FIG. 2 is a time chart illustrative of the operation of detecting an input signal at a signal detecting circuit of an embodiment.

The operation of the real time clock apparatus 10 according to the embodiment thus configured is as follows. FIG. 2 is a time chart illustrative of the detecting operation of the signal detecting circuit 30 when a normal switch input signal is inputted. The oscillating module 12 outputs the original oscillating clock signal of 32768 Hz, and inputs it to the dividing module 14. A plurality of the ½ divider circuits 15 configuring the dividing module 14 is connected in multi-stage, each divides the clock signal outputted from the previous stage by half. Then, the clock signal that is outputted from the divider circuit 15 at each stage having a period different from each other is outputted to the clock selecting circuit 16 along with the original oscillating clock signal of 32768 Hz.

The clock selecting module 24 of the clock selecting circuit 16 outputs a clock signal having a desired period (or frequency) selected from the clock signals outputted from the dividing module 14 by the clock selection signal externally supplied. The clock signal outputted from the clock selecting module 24 is supplied to the Ck1 input terminal and the Ck2 input terminal of each of the D-FFs 36 and 38 configuring the signal length detecting module 32 of the signal detecting circuit 30. The signal detecting circuit 30 monitors whether the switch 40 is turned on. In the switch input line 41 to which the D1 input terminal of the D-FF 36 is connected, the input signal is "L" when the switch 40 is not pressed down, and it is "H" when pressed. Moreover, the signal inputted to the switch input line 41 enters each reset terminal R of the D-FFs 36 and 38.

Now, suppose the switch 40 is pressed down at a time t1, in the state that each of the D-FFs 34, 36 and 38 is reset. Thus, as shown in (1) in FIG. 2, the input signal inputted to the switch input line 41 is turned to "H", and this "H" enters the D1 input terminal of the D-FF 36 configuring the signal length detecting module 32. At this time, in the D-FF 36, a clock signal A outputted from the clock selecting module 24 entering the Ck1 input terminal is "H", as shown in (2) in FIG. 2. However, since the Ck1 input terminal is operated at a rise time in the D-FF 36, the output of the Q1 output terminal remains as "L" (see (3) in the same drawing). Then, in the D-FF 36, a next clock signal B enters the Ck1 input terminal from the clock selecting module 24 when the switch input signal inputted to the switch input line 41 is "H", the terminal is operated at a rise a, and then the output of the Q1 output terminal is turned from "L" to "H".

On the other hand, in the D-FF 38 at the subsequent stage of the D-FF 36, since the output of the output terminal Q1 of the D-FF 36 entering the f Q2 input terminal is "L" at a rise time a of the clock signal B, the /Q2 output terminal keeps outputting "H", as shown in (4) in FIG. 2. The output "H" of the /Q2 output terminal enters the set terminal S3 of the D-FF 34 which is the detection storing module. Since the set terminal S3 is operated in negative logic in the D-FF 34, the output of the Q3 output terminal remains as "L" as shown in (5) in FIG. 2.

At the time when the clock selecting module 24 outputs a next clock signal C, when the input signal inputted to the switch input line 41 remains as "H", the D-FF 36 keeps outputting "H" from the Q1 output terminal. Therefore, in the D-FF 38, the output of the /Q2 output terminal is turned to "L" at a rise b of the clock signal C that enters the Ck2 input terminal (see (4) in FIG. 2), and the "L" is supplied to the set terminal S3 of the D-FF 34. In the D-FF 34, when "L" enters the set terminal S3, as shown in (5) in the same drawing, the output of the output terminal Q3 is turned to "H", and the "H" is outputted to the CPU as the detection signal of the input signal by the signal detecting circuit 30. More specifically, the signal detecting circuit 30 detects "H" of the switch input line 41 when the signal has a period that is one period or more of the clock signal outputted from the clock selecting module 24 and has a length passing through the rise times of two continuous clock signals.

When the press of the switch 40 is released at a time t2 and the input signal inputted to the switch input line 41 is turned to "L", the "L" enters each reset terminal R in which the D-FFs 36 and 38 are operated in negative logic. Thus, the D-FFs 36 and 38 are rest and the output of the Q1 output terminal of the D-FF 36 is turned to "L" as well as the output of the /Q2 output terminal of the D-FF 38 is turned to "H". Therefore, the D-FF 34 keeps outputting "H" that is the detection signal from the Q3 output terminal until a detection clear signal enters the reset terminal R3. When the CPU, not shown, receives the detection signal "H" from the signal detecting circuit 30, it recognizes that the switch 40 is turned on, and inputs the detection clear signal to the reset terminal R3 of the D-FF 34 to reset the D-FF 34. Thus, in the D-FF 34, the output of the Q3 output terminal is turned to "L".

Figure 3:
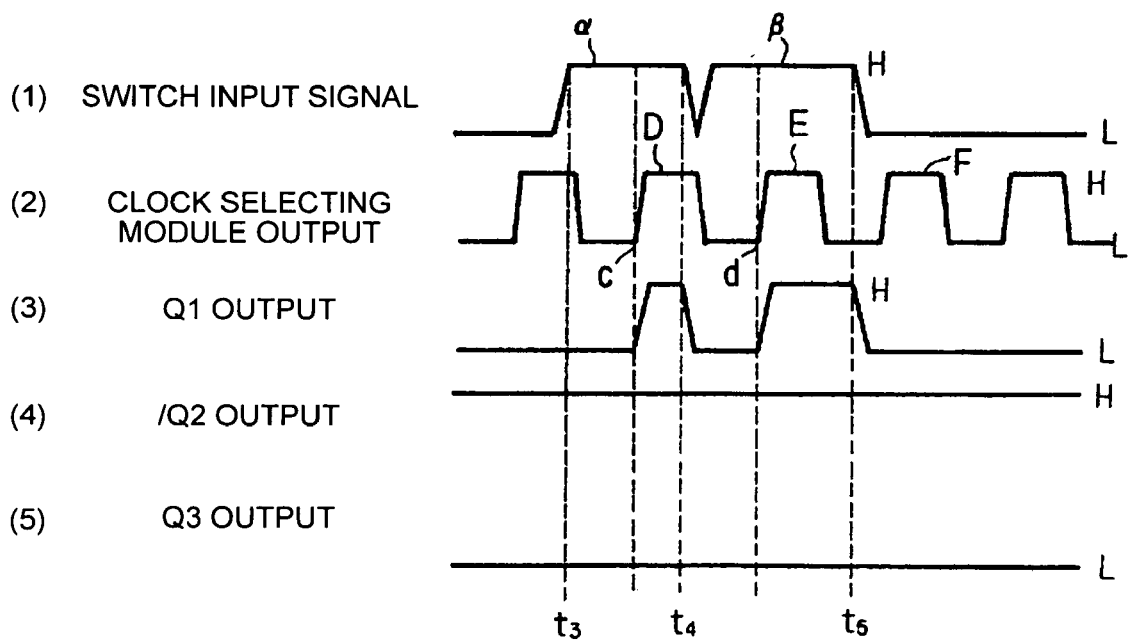
FIG. 3 is a time chart illustrative of the operation of removing chattering by a signal detecting circuit of an embodiment.

On the other hand, as shown in FIG. 3, the following is the case where noise short in time such as chattering is inputted. For example, as shown in (1) in FIG. 3, suppose the input signal inputted to the switch input line 41 at a time t3 is turned to "H". In the D-FF 36, when "H" enters the D1 input terminal, the clock selecting module 24 outputs it after the time t3, and "H" is outputted from the Q1 output terminal at a rise c of a clock signal D entering the Ck1 input terminal (see (2) and (3) in FIG. 3). At this time, the output of the /Q2 output-terminal of the D-FF 38 remains as "H" as similar to the description above, as shown in (4) in the same drawing. Thus, "L" is outputted from the Q3 output terminal of the D-FF 34, as shown in (5) in the same drawing.

As shown in (1) and (2) in FIG. 3, at a time t4 before the clock selecting module 24 outputs a next clock signal E, when the signal inputted in the switch input line 41 is momentarily turned to "L", the "L" enters the reset terminals R1 and R2 of the D-FFs 36 and 38. Therefore, the states of the D-FFs 36 and 38 are reset, and the output of the Q1 output terminal of the D-FF 36 is turned to "L" as shown in (3) in FIG. 3. Furthermore, in the D-FF 38, the output of the /Q2 output terminal remains as "H", and the Q3 output terminal of the D-FF 34 keeps outputting "L". More specifically, the signal detecting circuit 30 does not detect a portion α where the switch input signal inputted to the switch input line 41 is turned to "H".

When the signal inputted to the switch input line 41 is momentarily turned to "L" at a time t4 and quickly returned to "H", in the D-FF 36, the output of the Q1 output terminal is turned to "H" at a rise d of the next clock signal E inputted to the Ck1 input terminal. Also at this time, the output of the /Q2 output terminal of the D-FF 38 remains as "H", and the output of the Q3 output terminal of the D-FF 34 remains as "L". Then, when the input signal of the switch input line 41 is turned to "L" at a time t5 before the clock selecting module 24 outputs a next clock signal F, the output of the Q1 output terminal of the D-FF 36 is turned to "L" as described above. Thus, as shown in (5) in FIG. 3, a portion β of the switch input line 41 is not detected by the signal detecting circuit 30.

More specifically, when the switch 40 is pressed down and the switch input line 41 is turned to "H", the signal detecting circuit 30 according to the embodiment does not detect it unless otherwise a length of time has elapsed that two rises of the continuous clock signals outputted from the clock selecting module 24 enter. Therefore, the signal detecting circuit 30 removes noise such as chattering generated when the switch 40 is pressed down, and can surely detect only the required signal indicating that the switch 40 is pressed down.

In addition to this, since the signal detecting circuit 30 according to the embodiment uses the oscillator frequency of the real time clock apparatus mounted on almost all of electronic appliances, an oscillator circuit for exclusive use is not required, and power consumption is hardly increased. Furthermore, in the embodiment, the clock signals that are outputted from the dividing module 14 and have a plurality of periods different from each other are freely selected for detecting the input signal. Thus, it can detect input signals in various lengths easily. Moreover, the embodiment uses the clock signal that the output frequency of the oscillating module 12 is divided, the oscillator using the quartz oscillator. Therefore, highly accurate timing design is possible more than software processing, etc., and the input signals having different lengths can be detected highly accurately. Besides, since the real time clock apparatus is typically operated to back up data, while the power source of an electronic appliance main body is turned off, the detected result of the input signals of the signal detecting circuit 30 can be confirmed while it is off, when the electronic appliance main body returns to operation.

In addition, in the embodiment, an example is described wherein the signal length detecting module 32 is formed by serially connecting two D-FFs 36 and 38. However, three or more flip flops may be serially connected for detection by using three or more continuous rises or falls of clock signals. Furthermore, in the embodiment, an example is described wherein the switch 40 is pressed down. However, for example, it can be adapted to the case where a signal input from other electronic appliances is detected.

Figure 4:
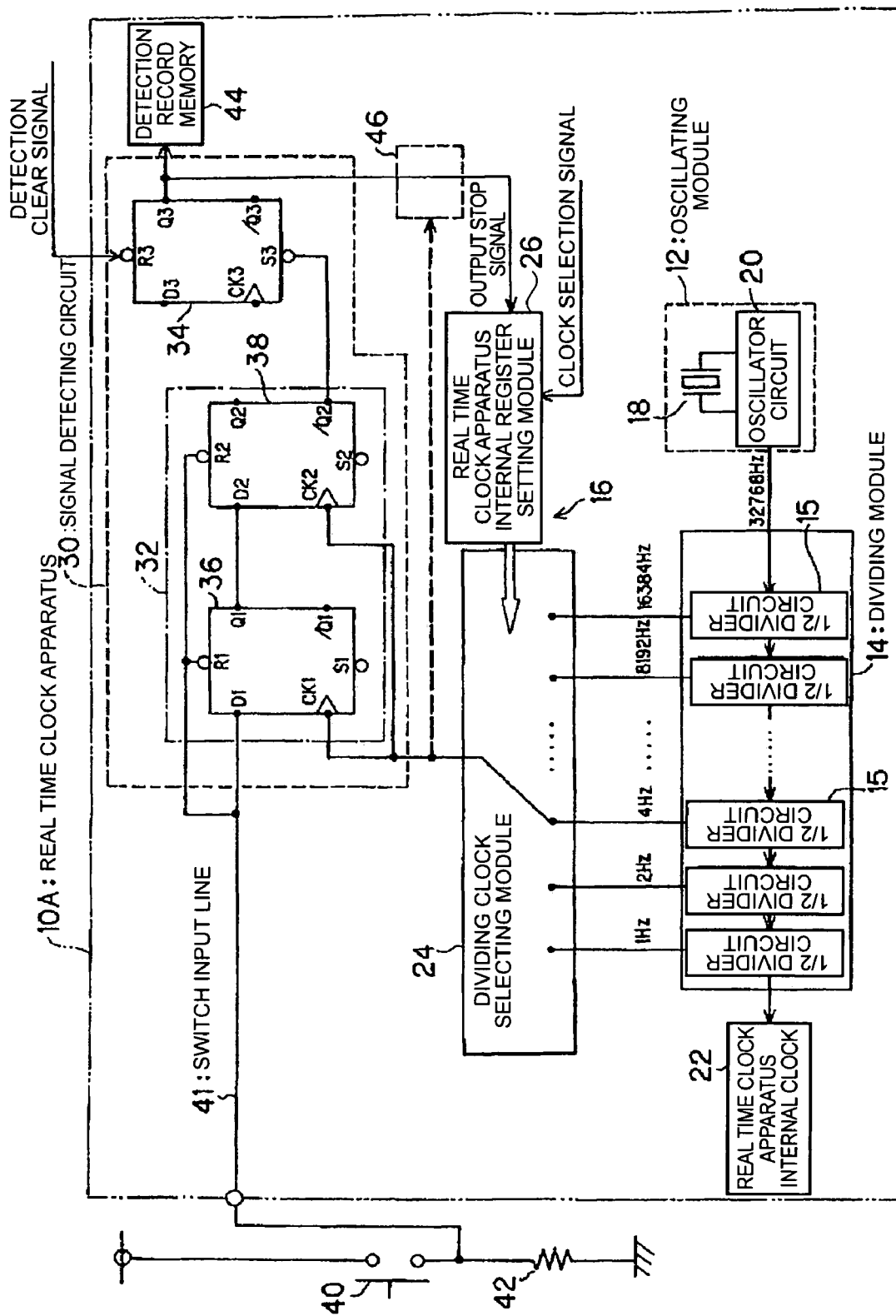
FIG. 4 is a block diagram illustrating part of a real time clock apparatus of another embodiment.

FIG. 4 is a block diagram illustrating a second embodiment. A real time clock apparatus 10A according to this embodiment has a one-bit detection record memory 44 which is connected to a Q3 output terminal of a D-FF 34 like a flag. The detection record memory 44 is configured of a low power consumption device such as C-MOS. In the D-FF 34, a bit is provided by "H" which is outputted from a Q3 main terminal and is a detection signal of an input signal, and it indicates that a signal detecting circuit 30 detects the input signal.

Furthermore, "H" outputted from the Q3 output terminal of the D-FF 34 is supplied to an internal register setting module 26 of a clock selecting circuit 16 as a (clock) output stop signal. When "H" is inputted from the D-FF 34, the internal register setting module 26 stops outputting the clock signal from a clock selecting module 24. Thus, for example, the function of the clock selecting module 24 can be stopped when the signal detecting circuit 30 detects an input signal during non-use of an electronic appliance main body, for example, at night, and power consumption can be further reduced. Moreover, the function of the signal detecting circuit 30 (the D-FFs 34, 36 and 38) is stopped when the D-FF 34 outputs "H", and thus power consumption can be further reduced. In addition to this, since the detected result is stored and held in the detection record memory 44, the detected result of the input signals can be known when the operation of the electronic appliance main body is returned.

In addition, a delay circuit 46 as shown in a broken line may be disposed between the output side of the D-FF 34 and the internal register setting module 26 as required, and "H" inputted to the internal register setting module 26 is deferred for a predetermined time period. Consequently, the operation time of the detection clock is prolonged to omit the process of stop and restart of the detection clock. Therefore, the real time clock apparatus 10A can be applied to various electronic appliances in such a way that two or more continuous signals such as double clocks by a mouse are easily detected. In this case, when a clock signal outputted from the clock selecting module 24 enters the delay circuit 46 to count clock signals to defer them for a predetermined time, it is not necessary to provide an oscillator circuit to clock delay time. Furthermore, the clock signal supplied to the delay circuit 46 may be different from the clock signal supplied to the signal detecting circuit 30.

The invention claimed is:

1. A real time clock apparatus comprising:
    an oscillating module which outputs an original oscillating clock signal having a predetermined frequency;
    a dividing module which divides the original oscillating clock signal outputted from the oscillating module plurality of times to generate and output a plurality of clock signals having periods that are different from each other;
    a clock selecting module which outputs a given clock signal among the plurality of clock signals based on a supplied selection signal; and
    a signal detecting circuit which is connected to an external signal source, and which detects a length of an inputted signal by the clock signal outputted from the clock selecting module and senses whether the inputted signal is an input signal from the signal source.

2. The real time clock apparatus according to claim 1, wherein the signal detecting circuit has:
    a signal length detecting module which detects that the input signal has at least a predetermined length by a period of the clock signal; and
    a detection storing module which stores detected information when the signal length detecting module detects the input signal.

3. The real time clock apparatus according to claim 1, wherein detection of the length of the inputted signal is done as at least one of a rise and a fall of the clock signal occurs.

4. The real time clock apparatus according to claim 1, wherein the signal detecting circuit outputs a clock output stop signal that stops the clock selecting module from outputting the clock signal when the input signal is detected.

5. The real time clock apparatus according to claim 4, wherein the clock output stop signal outputted from the signal detecting circuit enters the clock selecting module through a delay circuit.

6. The real time clock apparatus according to claim 5, wherein the delay circuit delays the inputted clock output stop signal based on the clock signal outputted from the clock selecting module.

* * * * *